(12) United States Patent
Kang

(10) Patent No.: US 8,256,112 B2
(45) Date of Patent: Sep. 4, 2012

(54) METHOD OF MANUFACTURING HIGH DENSITY PRINTED CIRCUIT BOARD

(75) Inventor: Myung Sam Kang, Daejeon (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 931 days.

(21) Appl. No.: 12/314,783

(22) Filed: Dec. 16, 2008

(65) Prior Publication Data

US 2009/0101510 A1    Apr. 23, 2009

Related U.S. Application Data

(62) Division of application No. 11/599,435, filed on Nov. 15, 2006, now abandoned.

(30) Foreign Application Priority Data

Nov. 18, 2005    (KR) .................. 10-2005-0110805

(51) Int. Cl.
*H01K 3/10*    (2006.01)

(52) U.S. Cl. ................. 29/852; 29/830; 29/840; 29/846

(58) Field of Classification Search .................. 29/830, 29/840, 846, 852
See application file for complete search history.

(56) References Cited

U.S. PATENT DOCUMENTS

| | | | |
|---|---|---|---|
| 3,161,945 A | 12/1964 | Anderson et al. | |
| 5,936,843 A | 8/1999 | Ohshima et al. | |
| 5,985,521 A * | 11/1999 | Hirano et al. | 430/314 |
| 6,198,166 B1 | 3/2001 | Coronati | |
| 6,215,011 B1 | 4/2001 | Bishop | |
| 6,281,448 B1 | 8/2001 | Tsukamoto | |
| 6,378,201 B1 * | 4/2002 | Tsukada et al. | 29/852 |
| 6,522,018 B1 | 2/2003 | Tay et al. | |
| 6,710,261 B2 | 3/2004 | Takebe et al. | |
| 6,711,813 B1 * | 3/2004 | Beyne et al. | 29/852 |
| 6,812,412 B2 | 11/2004 | Obata et al. | |
| 2002/0043399 A1 | 4/2002 | Sasaki et al. | |
| 2003/0197514 A1 | 10/2003 | Hsu | |
| 2006/0043603 A1 | 3/2006 | Ranade et al. | |

FOREIGN PATENT DOCUMENTS

| | | |
|---|---|---|
| DE | 199 10 482 | 5/2000 |
| EP | 0 080 689 | 6/1983 |
| EP | 0 213 336 | 3/1987 |
| KR | 10-2005-49452 | 5/2005 |

OTHER PUBLICATIONS

Office Action dated on Dec. 22, 2008 in parent U.S. Appl. No. 11/599,435.
Office Action dated on Jul. 22, 2009 in parent U.S. Appl. No. 11/599,435.
Korean Office Action dated on Oct. 25, 2006 and issued in Korean Patent Application 10-2005-0110805.
U.S. Appl. No. 11/599,435, filed Nov. 15, 2006, Myung Sam Kang.
Office Action mailed Feb. 4, 2010 in parent U.S. Appl. No. 11/599,435.

* cited by examiner

*Primary Examiner* — Carl Arbes

(57) ABSTRACT

The present invention relates to a high density printed circuit board and a method of manufacturing the same which enable a thin printed circuit board to be manufactured and can overcome problems occurring in a conventional method of manufacturing a printed circuit board because a conventional CCL is not used as a raw material. The high density printed circuit board includes a first insulating layer having a constant thickness, and a pair of first circuit layers embedded in two sides of the first insulating layer, respectively.

6 Claims, 8 Drawing Sheets

METHOD OF MANUFACTURING HIGH DENSITY PRINTED CIRCUIT BOARD

CROSS-REFERENCE TO RELATED APPLICATIONS

This application is a U.S. divisional application filed under 35 USC 1.53(b) claiming benefit of U.S. Ser. No. 11/599,435 filed in the United States on Nov. 15, 2006 now abandoned, which claims earlier benefit to Korean Patent Application No. 10-2005-0110805 filed with the Korean Intellectual Property Office on Nov. 18, 2005, the disclosure of which is incorporated herein by reference in its entirety.

BACKGROUND OF THE INVENTION

1. Field of the Invention

The present invention relates to a printed circuit board and a method of manufacturing the same, and, more particularly, to a high density printed circuit board and a method of manufacturing the same which enable a thin printed circuit board to be manufactured and can overcome problems occurring in a conventional method of manufacturing a printed circuit board because a conventional copper clad laminate (CCL) is not used as a raw material. The present invention relates to a printed circuit board.

2. Description of the Related Art

With the development of the electronic industry, electronic parts having high functionality and small size have been required. In particular, the demand for decreasing the thickness of electronic parts which are installed in portable terminals, in order to decrease the thickness of the portable terminals, is increasing.

In this situation, the reduction of the height of a package is one of the principal issues.

As various services in the mobile communication field are increasing, the number of electronic parts which are installed in a mobile phone is also increasing. Since the reduction of the area of the mobile phone is one of the demands of the final user, the trend that several chips are mounted on one interposer is increasing.

A Chip Scale Package (CSP), which is used as an interposer for ICs, has been widely used in mobile phones. Recently, almost all packages are using CSP, and almost all ICs are being stacked in such a CSP.

However, in order to stack more ICs, since the total height of the package is constant, methods of mounting the ICs while maintaining the height of the package have been sought in two directions.

That is, the methods include a method of decreasing the thickness of the ICs and a method of decreasing the thickness of the interposer.

The thickness of ICs ranges from 50 µm to 75 µm, and high level techniques for mounting them have already been established. Although researches into ICs thinner than the thickness range are being conducted, it is considered that such techniques have reached the limit of current technology.

The interposer is also becoming extremely thin, but it is considered that the techniques for decreasing the thickness of the interposer have also reached limit of current technology. Accordingly, in order to further decrease the thickness of the interposer, the technique for decreasing the thickness of components of the interposer by approaching the lower limit values of the components has been studied.

Meanwhile, in a conventional process of manufacturing a printed circuit board, methods of forming a circuit are classified into a tenting method (an etching method) and an additive method.

The tenting method is a method of forming a circuit pattern by forming an etching resist pattern on a copper foil formed on a CCL to a constant thickness, and etching portions other than the circuit by dipping a substrate, on which the etching resist pattern is formed, into an etching solution.

The additive method, which has recently been widely used, is a method of realizing a circuit pattern by forming a plating resist pattern on a CCL, plating only portions to form a circuit, and removing the plating resist pattern.

The tenting method has a low manufacturing cost, but has a limitation in forming fine circuit patterns. Accordingly, to overcome that limitation, the additive method is employed.

FIGS. 1A to 1D show a conventional method of manufacturing a printed circuit board using a semi-additive method.

In FIG. 1A, a plating resist pattern is formed by applying a plating resist 13 on the surface of the copper foil 12 of a CCL, which includes the copper foil 12 and a reinforced substrate 11, and developing the plating resist 13.

The thickness of the copper foil 12 of a typical CCL is about 0.5 µm to 3 µm. Typically, a photosensitive dry film is used as the plating resist 13.

In FIG. 1B, a plating layer 14 is formed through electrolytic plating. During plating, the copper foil 12 serves as a seed layer. However, in this case, the thickness of the plating layer 14 formed through electrolytic plating is not constant throughout the entire region due to deviation occurring during plating.

In FIG. 1C, the remaining plating resist 13 is separated after the plating is completed.

When the plating resist 13 is separated, it is removed by dipping the resulting CCL into a separating liquid. In this case, there is a problem in that the plating resist 13 is not completely removed, thus some of the plating resist 13 remains on the side walls of the plating layer 14.

In FIG. 1D, when the portions of the copper foil 12 that do not form a circuit pattern are removed through soft etching, and thus only a desired circuit pattern remains, the circuit pattern is formed.

However, even when the additive method is employed, it is still impossible to obtain a desired thickness.

SUMMARY OF THE INVENTION

Accordingly, the present invention has been made keeping in mind the above problems occurring in the prior art, and an object of the present invention is to provide a method of manufacturing a printed circuit board without using a conventional CCL as a raw material.

Another object of the present invention is to provide a method of manufacturing a thin printed circuit board.

In order to accomplish the above object, the present invention provides a high density printed circuit board, including a first insulating layer having a constant thickness; and a pair of first circuit layers embedded in two sides of the first insulating layer, respectively.

Further, the present invention provides a method of manufacturing a high density printed circuit board, including preparing a pair of carrier films, each of which has a copper foil formed on one side thereof; forming plating resists, each having a circuit pattern, on the copper foils of the pair of carrier films, and then forming plating layers thereon; removing the plating resists from the pair of carrier films, and then attaching the carrier films to each other by causing the plating layers to face each other and interposing an adhesive between the pair of carrier films; removing the pair of carrier films, forming via holes, forming a seed layer, and then forming the plating resists to open only the via holes; and performing plating, and then separating the plating resists and removing the seed layer through an etching process.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

The present invention will be described in more detail with reference to the accompanying drawings below.

Figure 1A:
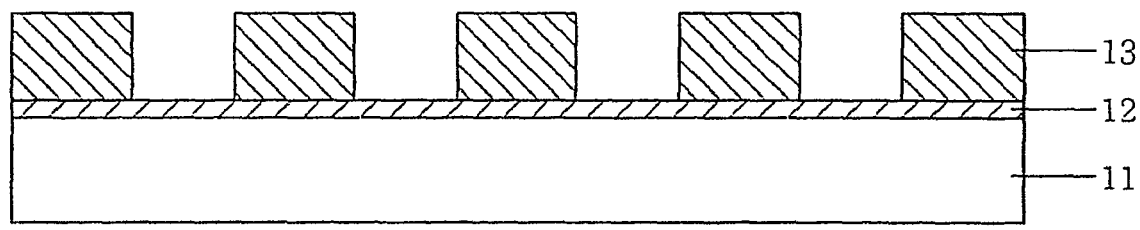
FIGS. 1A to 1D are views showing a method of manufacturing a printed circuit board based on a conventional semi-additive method.
Figure 1B:
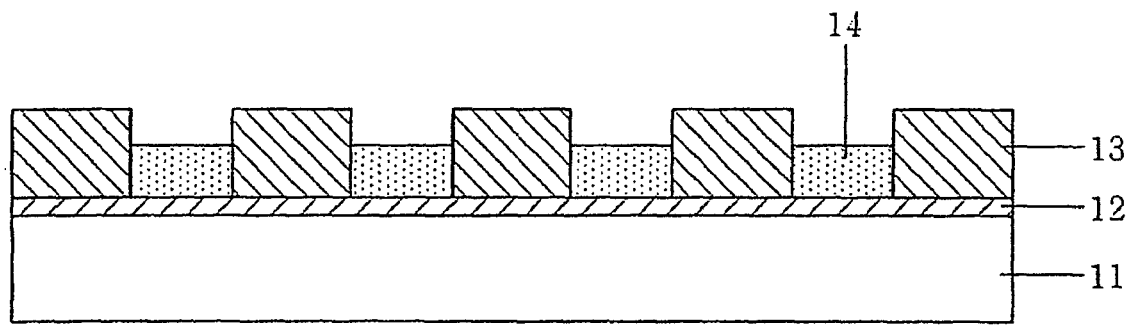
Figure 1C:
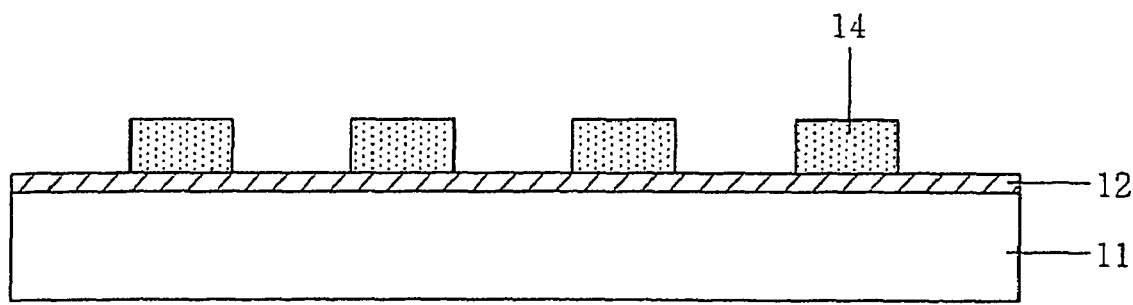
Figure 1D:
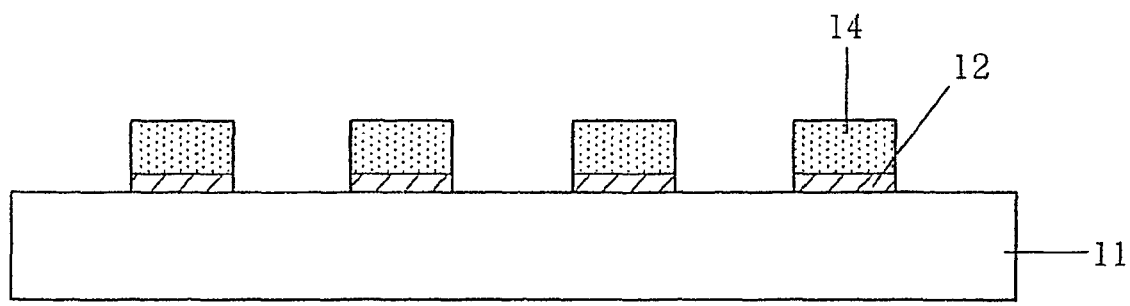
Figure 2:
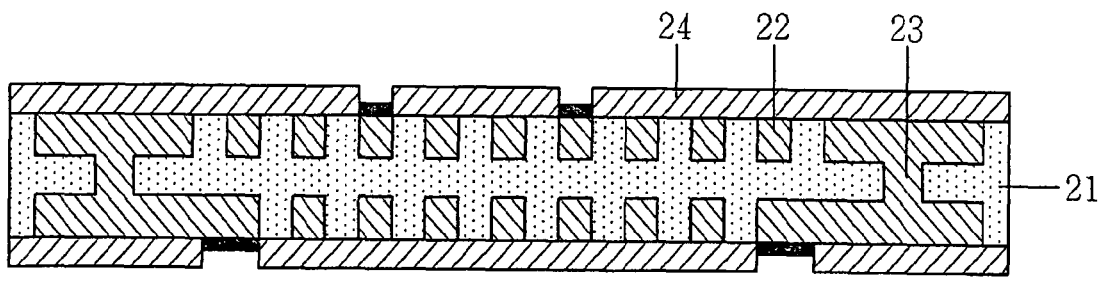
FIG. 2 is a cross-sectional view showing a high density printed circuit board according to an embodiment of the present invention.

FIG. 2 is a cross-sectional view of a printed circuit board according to an embodiment of the present invention.

Referring to FIG. 2, in the printed circuit board according to the embodiment of the present invention, circuit patterns 22 are embedded in an epoxy resin layer 21. Here, the thickness of the circuit patterns 22 ranges from 15 to 25 μm, so that the total thickness of the printed circuit board can be decreased to a value in a range of 30 to 50 μm, compared to the conventional art. The thickness of solder resists 24 also serves to decrease the total thickness of the printed circuit board because the solder resists 24 may be applied to such an extent that they do not cause a problem in mounting, due to the flatness of the surface of the printed circuit board.

FIGS. 3A to 3M show a method of manufacturing a high density printed circuit board according to an embodiment of the present invention. The method of manufacturing a high density printed circuit board according to the embodiment of the present invention will be described with reference to FIGS. 3A to 3M below.

Figure 3A:
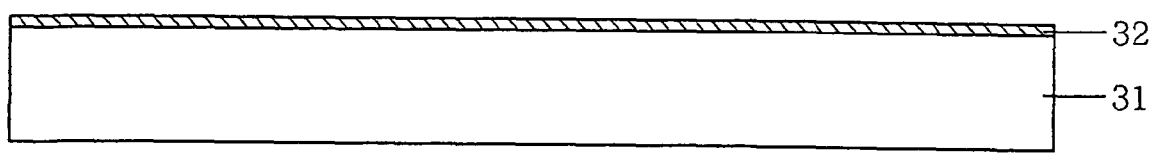
FIGS. 3A to 3M are views showing a method of manufacturing a double-sided high density printed circuit board according to an embodiment of the present invention.

First, as shown in FIG. 3A, the manufacturing process begins with two structures, each of which includes a carrier film 31 and a thin copper foil 32 attached to the carrier film 31.

Materials commonly used in manufacturing a printed circuit board are used as materials for the copper foil and the carrier film. It is preferred that the thickness of the copper foil 32 be 3 μm. Furthermore, it is preferred that the thickness of the carrier film 31 be 15 to 100 μm, and it is possible to use a metal, such as copper or aluminum, or an epoxy resin as the raw material of the carrier film 31.

The thin copper foil 32 and the carrier film 31 are attached to each other using an organic material or an inorganic material, and can be easily removed after a high temperature and high pressure process.

Figure 3B:
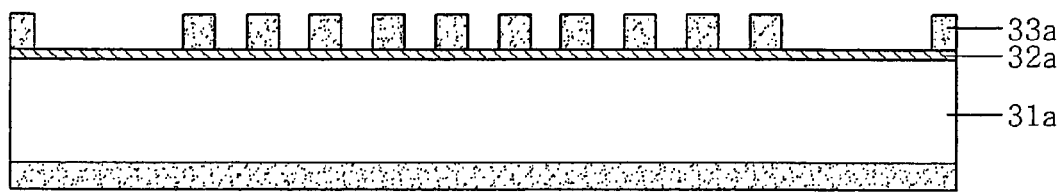
Figure 3C:
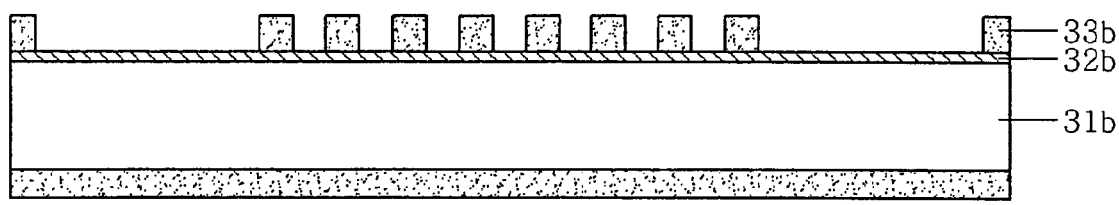

Then, as shown in FIGS. 3B and 3c, etching resists 33a are layered on two sides of one of the two structures, and etching resists 33b are layered on two sides of the other of the two structures, wherein each of the structure includes the copper foil 32 attached to the carrier film 31. Subsequently, circuit patterns are formed on any one of the etching resists 33a and any one of the etching resists 33b through an exposing and developing process.

The method of forming the etching resists 33a and 33b is classified as a photographic method or a screen printing method. The photographic method is classified as either a D/F method, which uses a dry film as the etching resist, or a liquid phase photosensitive material method, which uses a liquefied photosensitive material as the etching resist.

Figure 3D:
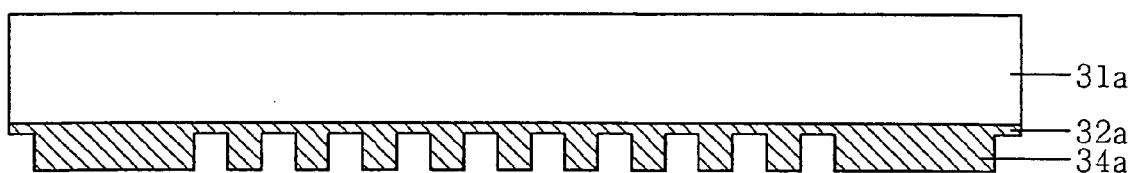
Figure 3E:
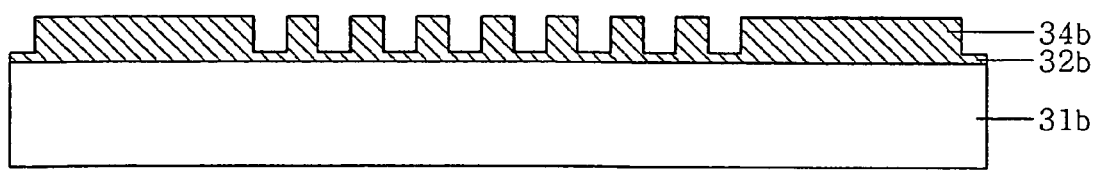

Then, as shown in FIGS. 3D and 3E, copper plating circuit layer 34a and 34b are formed on the etching resists 33a and 33b, respectively, by performing electrolytic plating using the copper foils 32a and 32b as a plating lead lines, and then the etching resists 33a and 33b are removed. The electrolytic copper plating is used for the copper plating for the etching resists 33a and 33b. A thick plating film is easily formed through the electrolytic copper plating, and the physical properties of a plating film are also excellent, compared to electroless copper plating.

Figure 3F:
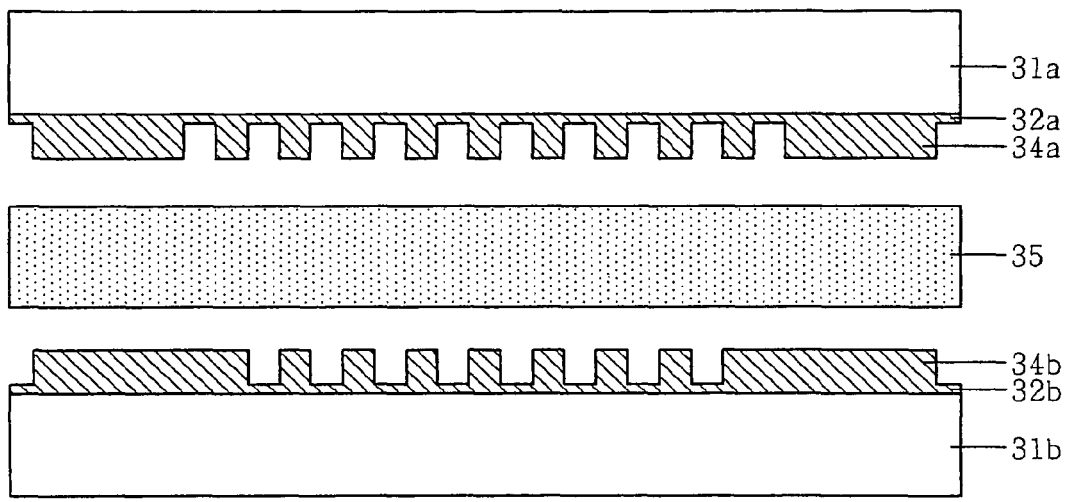

Then, as shown in FIG. 3F, the two base substrates, on each of which the copper plating layer circuit pattern 34a or 34b is formed, are attached to each other using an adhesive 35 interposed therebetween, through a high temperature and high pressure process.

In this case, the surface of each of the copper plating circuit layers 34a and 34b is subjected to a surface treatment in order to be easily adhered to the adhesive 35, and it is preferred that the surface treatment be a black treatment, a brown-black treatment or the like.

It is preferred that a prepreg that is used for interlayer insulation and has a suitable adhesive force when heat is applied thereto at the time of manufacturing a multi-layered printed circuit board be used as the adhesive 35.

The prepreg is a material in which an adhesive is impregnated into a glass fiber material, and is interposed between the copper plating circuit layers 34a and 34b in which the circuit patterns are formed, to serve as an adhesive layer between the copper plating circuit layers as well as an insulator therebetween.

Figure 3G:
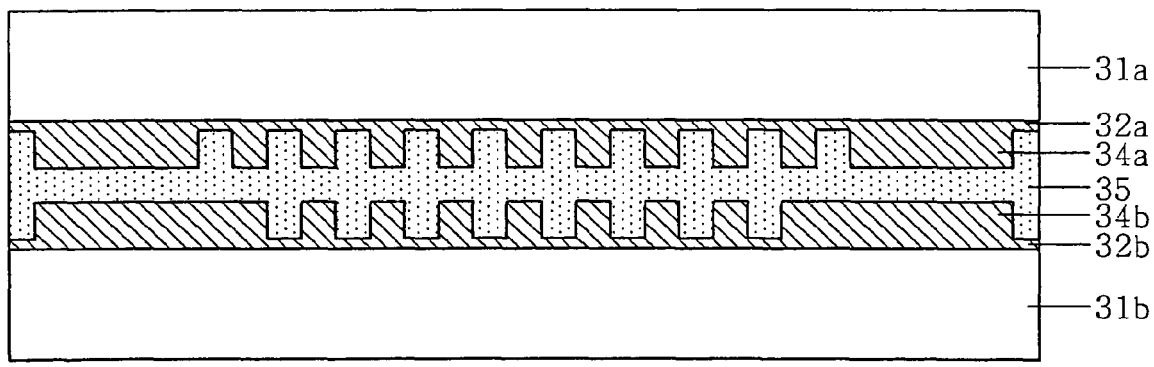

When the adhesive 35 is aligned as shown in FIG. 3F, and then is pressed from the upper and lower surfaces thereof while being heated, as shown in FIG. 3G, both surfaces of the adhesive 35 are forced into the copper plating circuit layers 34a and 34b and, simultaneously, the copper plating circuit layers 34a and 34b are attached to each other due to the adhesive 35 interposed therebetween.

Figure 3H:
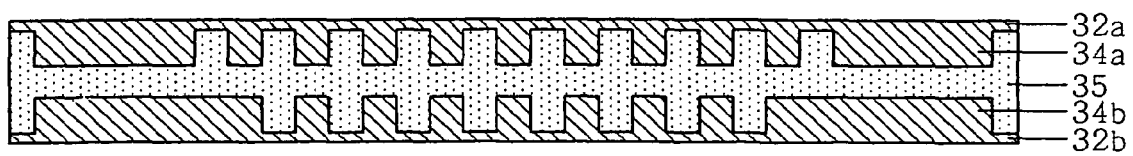

Then, as shown in FIG. 3H, the carrier films 31a and 31b are removed. In this case, it is possible to remove them by hand.

Figure 3I:
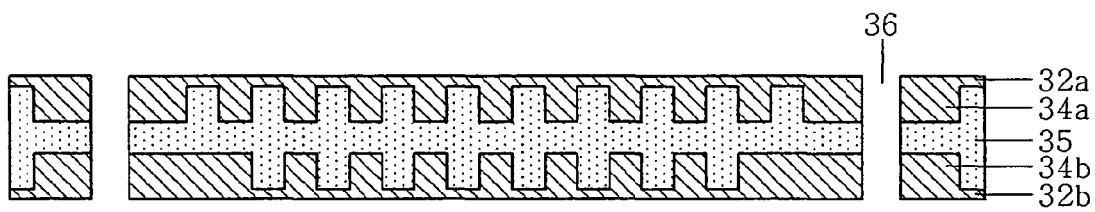

Next, as shown in FIG. 3I, via holes 36 are formed in the attached structure to connect signals between the first layer and the second layer through a drilling process.

In this case, it is preferred that the drilling process be a mechanical drilling process using a Computer Numerically Controlled (CNC) drill, because the copper plating circuit layers 34a and 34b and the adhesive 35 must be drilled.

Figure 3J:
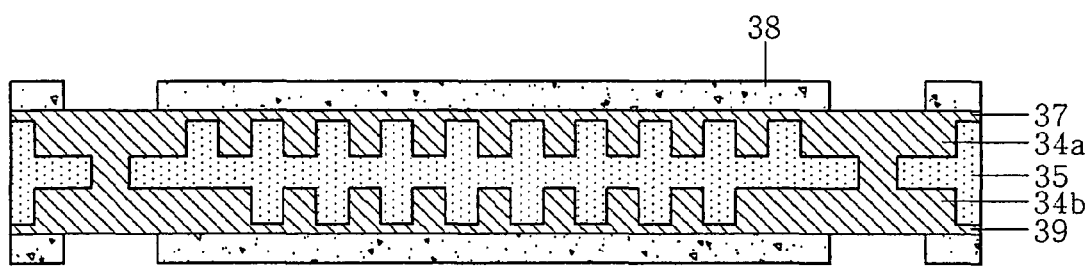

Then, as shown in FIG. 3J, a seed layer 37 is formed on the entire substrate to a thickness of 1.0 μm to 3.0 μm by electroless copper plating.

The copper plating for the inner walls of the via holes is performed in the sequence of electroless copper plating and electrolytic copper plating, because the inner walls of the drilled via holes are made of epoxy resin, serving as an insulator, and thus the electrolytic copper plating due to electrolysis cannot be performed. Accordingly, first, the electroless copper plating is performed, and then the electrolytic copper plating is performed, thereby completely copper plating the inner walls of the via holes.

The electroless copper plating is an exclusive method of providing a surface of a nonconductor such as a resin, a ceramic and glass with conductivity.

Since the inner holes of the via holes are provided with conductivity by performing the electroless copper plating, the electrolytic copper plating can be performed. In this case, plating resists 38 are formed on the portion other than the via portion in order to perform copper plating of only the via portion. That is, after the plating resists 38 are applied, only the via portion is exposed.

Then, a copper plating layer 39 is formed by performing electrolytic copper plating of only the via portion. In this case, a thick plating film is easily formed through the electrolytic plating, and the physical properties of the plating film are also excellent, compared to the electroless plating.

The inner walls of the via holes 36 are plated using the copper plating layer 39, and simultaneously the inner portions of the via holes 36 is filled with the copper plating layer 39.

Figure 3K:
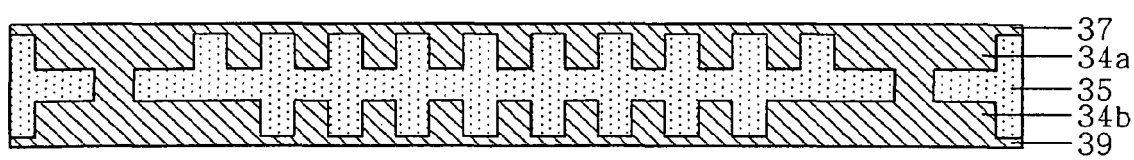

Next, as shown in FIG. 3K, after the copper plating layer 39 is formed, the plating resists 38 are removed to expose the seed layer 37.

Figure 3L:
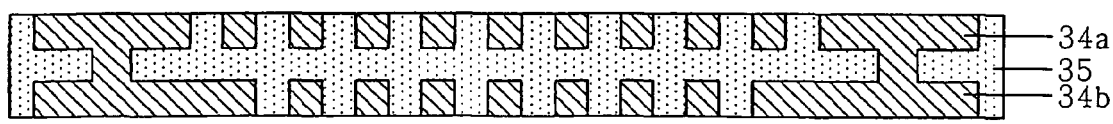

Then, as shown in FIG. 3L, the seed layer 37 and the copper foils 32a and 32b are removed through an etching process. Here, the etching process is continuously performed until the adhesive 35 is exposed.

That is, the pattern of the adhesive 35 is externally exposed by etching the surfaces of the seed layer 37 and the copper foils 32a and 32b. Through these processes, when a four layered printed circuit board is formed later, a core layer, on the upper and lower surfaces of which a first layer circuit pattern and a second layer circuit pattern are formed, is formed.

Figure 3M:
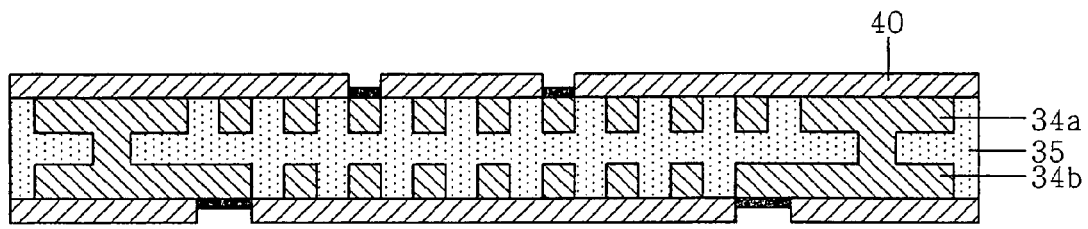

Furthermore, as shown in FIG. 3M, solder resists 40 are applied, the portion to be surface-treated (gold plated or Organic Surface Protection (OSP) treated) is formed through exposing and developing processes, and the surface treatment is performed, thereby completely manufacturing an interposer.

Figure 4A:
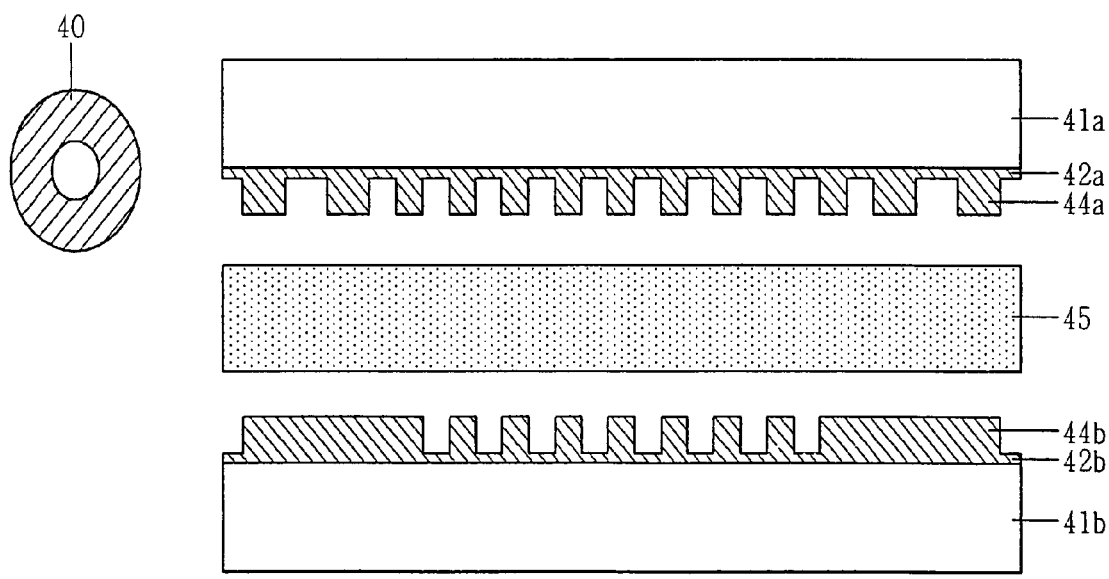
FIGS. 4A to 4H are process diagrams showing a process of forming via holes using a laser drill in the method of manufacturing a high density printed circuit board according to the embodiment of the present invention.

FIGS. 4A to 3H are process diagrams showing a process of forming via holes using a laser drill in the method of manufacturing a high density printed circuit board according to an embodiment of the present invention.

First, referring to FIG. 4A, the portion, in which via is to be formed, of the upper copper plating circuit layer 44a of the two copper plating circuit layers 44a and 44b forms an annular ring 40.

The two base substrates, on which are formed the upper copper plating circuit layer 44a including the annular ring 40 formed on the portion in which the via is to be formed, and the lower copper plating circuit layer 44b, are attached to each other using an adhesive 45 through a high temperature and high pressure process.

In this case, the surface of each of the copper plating circuit layers 44a and 44b is subjected to a surface treatment in order to be easily adhered to the adhesive 45, and it is preferred that the surface treatment be a black treatment, a brown-black treatment or the like.

It is preferred that a prepreg that is used for interlayer insulation and has a suitable adhesive force when heat is applied thereto at the time of manufacturing a multi-layered printed circuit board be used as the adhesive 45.

When the adhesive 45 is aligned as shown in FIG. 4A, and then is pressed from the upper and lower surfaces thereof while being heated, both surfaces of the adhesive 45 are forced into the copper plating circuit layers 44a and 44b and simultaneously the copper plating circuit layers 44a and 44b are attached to each other through the adhesive 45.

Figure 4B:
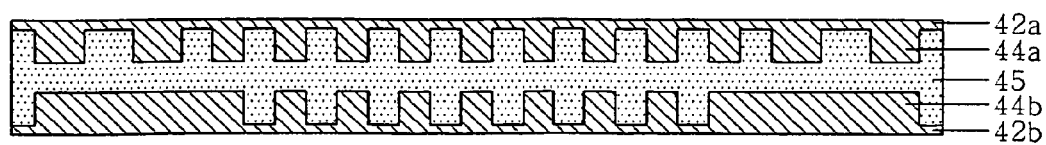

Then, as shown in FIG. 4B, the carrier films 41a and 41b are removed. In this case, it is possible to remove them by hand.

Figure 4C:
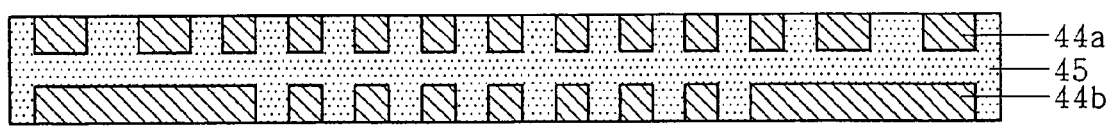

Next, as shown in FIG. 4C, the carrier films 41a and 41b are removed, and then the seed layers 42a and 42b are removed through an etching process.

Figure 4D:
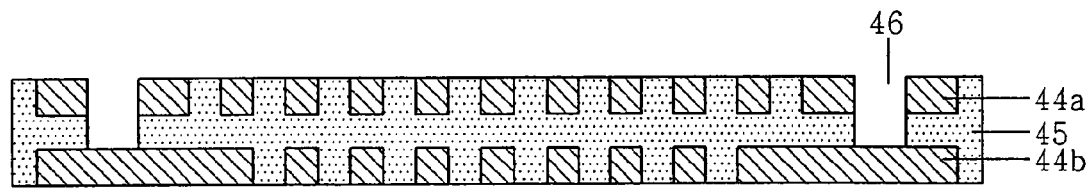

Next, as shown in FIG. 4D, via holes 46 are formed in the resulting structure to connect signals between the first layer and the second layer through a laser drilling process. In this case, the laser drill is used so as not to affect the lower copper plating circuit layer 44b. Since the annular ring 40 is already formed on the upper copper plating circuit layer 44a, and the copper plating circuit layer 44a of the portion in which the via is to be formed is removed, it is not necessary to conduct the process of removing the copper plating circuit layer 44a.

Figure 4E:
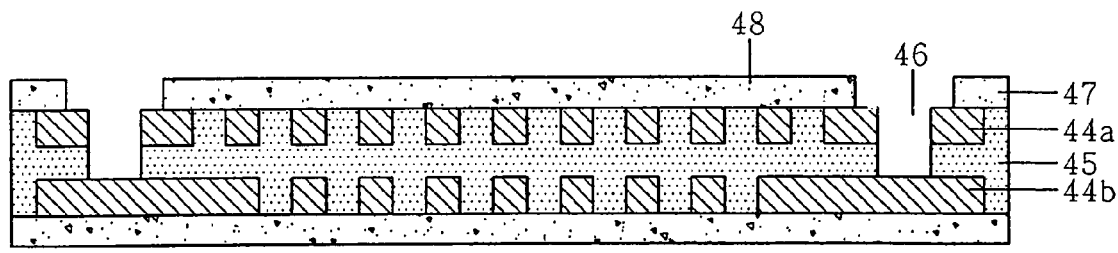

Then, as shown in FIG. 4E, a seed layer 47 is formed throughout the substrate, on which the via 46 is formed, to a thickness of 1.0 μm to 3.0 μm by electroless copper plating.

The copper plating for the inner walls of the via holes is performed in the sequence of electroless copper plating and electrolytic copper plating, because the inner walls of the drilled via holes is made of epoxy resin, serving as an insulator, and thus the electrolytic copper plating cannot be performed. Accordingly, first, the electroless copper plating is performed, and then the electrolytic copper plating is performed, thereby entirely copper plating the inner walls of the via holes.

In this case, plating resists 48 are formed on the portion other than the via in order to perform copper plating of only the via portion. That is, after the plating resists 48 are applied, only the via portion is exposed.

Figure 4F:
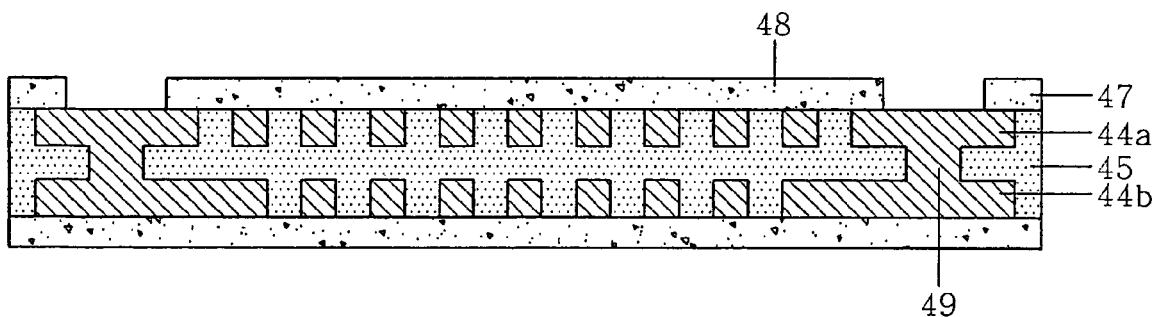

Then, as shown in FIG. 4F, a copper plating layer 49 is formed by performing electrolytic copper plating of only the via portion. In this case, a thick plating film is easily formed through the electrolytic plating, and the physical properties of the plating film are also excellent, compared to the electroless plating.

The inner walls of the via holes 46 are plated using the copper plating layer 49, and, simultaneously, the inner portions of the via holes 46 are filled with the copper plating layer 49.

Figure 4G:
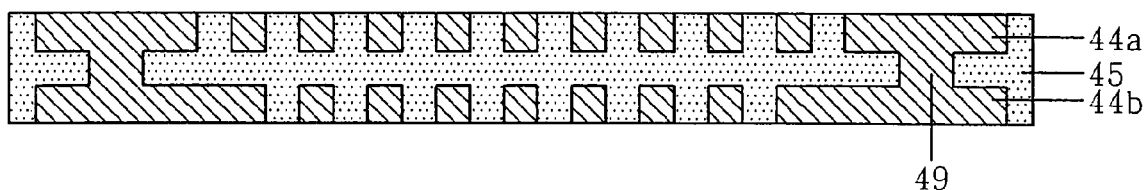

Next, as shown in FIG. 4G, after the copper plating layer 49 is formed, the plating resists 48 are removed to expose the seed layer 47.

Then, the seed layer 47 and the copper foils 42a and 42b are removed through an etching process. In this case, the etching process is continuously performed until the adhesive 45 is exposed.

That is, the pattern of the adhesive 45 is externally exposed through etching the surfaces of the seed layer 47 and the copper foils 42a and 42b. Through these processes, when a four layered printed circuit board is formed later, a core layer, on the upper and lower surfaces of which a first layer circuit pattern and a second layer circuit pattern are formed, is formed.

Figure 4H:
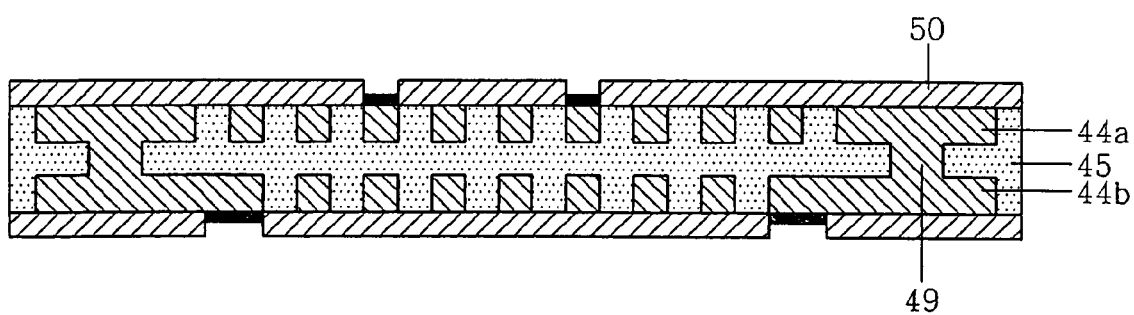

Furthermore, as shown in FIG. 4H, solder resists 50 are applied, the portion to be surface-treated (gold treated or OSP treated) is formed through exposing and developing processes, and the surface treatment is performed, thereby completely manufacturing an interposer.

As described above, according to the present invention, it is possible to decrease the total thickness of the interposer by about 60 μm to 110 μm.

Furthermore, according to the present invention, since the circuit is formed using a seed layer, resulting in a fine pattern, the adhesive force of the circuit is increased, poor quality owing to insufficient adhesive force does not occur during subsequent processes, and the breaking of a wire does not occur.

Furthermore, according to the present invention, since the seed layer is removed and the removed portion is a reference for flatness, the flatness of the pattern is better than that of conventional process.

As described above, although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of manufacturing a high density printed circuit board, comprising:
    preparing a pair of carrier films, each of which has a copper foil formed on one side thereof;
    forming plating resists, each having a circuit pattern, on the copper foils of the pair of carrier films, and then forming plating layers thereon;
    removing the plating resists from the pair of carrier films, and then attaching the carrier films to each other by causing the plating layers to face each other and interposing an adhesive between the pair of carrier films;
    removing the pair of carrier films, forming via holes, forming a seed layer, and then forming the plating resists to open only the via holes; and
    performing plating, and then separating the plating resists and removing the seed layer through an etching process.

2. The method as set forth in claim 1, wherein the forming plating resists comprises:
    forming a plating resist on the copper foil of each of the pair of carrier films;
    forming the circuit pattern in each of the plating resists; and
    forming plating layers through electrolytic plating using the copper foil as a plating lead line.

3. The method as set forth in claim 1, wherein the removing plate resists comprises:
    removing the plating resists from the pair of carrier films, and then interposing an adhesive between the pair of carrier films; and
    attaching the carrier films to each other in a state in which the plating layers of the pair of carrier films face each other and the adhesive is placed between the pair of carrier films.

4. The method as set forth in claim 1, wherein the removing pair of carrier films comprises:
    removing the pair of carrier films;
    forming the via holes through a drilling process; and
    forming a seed layer, forming the plating resists, and opening the via holes.

5. The method as set forth in claim 1, wherein the performing plating comprises:
    separating the plating resists after plating; and
    removing the seed layer through an etching process.

6. The method as set forth in claim 1, wherein, at the forming plating resists, an annular ring is formed in one of the plating resists to expose the portion in which the via holes are to be formed when the circuit patterns are formed in the plating resists, and
    wherein the removing the pair of carrier films comprises:
    removing the carrier films;
    removing the copper foil through the etching process to open the formed via holes;
    forming the via holes through a laser drilling process; and
    forming a seed layer, forming the plating resists, and then opening the via holes.

* * * * *